United States Patent
Yu et al.

(10) Patent No.: US 10,373,831 B2
(45) Date of Patent: Aug. 6, 2019

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Ji-won Yu, Yongin-si (KR); Hyun-suk Lee, Hwaseong-si (KR); Ji-woon Park, Seoul (KR); Gi-hee Cho, Seongnam-si (KR); Hee-sook Park, Hwaseong-si (KR); Woong-hee Sohn, Seoul (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/651,068

(22) Filed: Jul. 17, 2017

(65) Prior Publication Data
US 2018/0019125 A1   Jan. 18, 2018

(30) Foreign Application Priority Data
Jul. 18, 2016   (KR) .......................... 10-2016-0090778

(51) Int. Cl.
| | | |
|---|---|---|
| C23C 16/455 | (2006.01) | |
| H01L 21/205 | (2006.01) | |
| H01L 21/54 | (2006.01) | |
| H01L 21/67 | (2006.01) | |
| H01L 21/677 | (2006.01) | |

(Continued)

(52) U.S. Cl.
CPC .......... *H01L 21/205* (2013.01); *C23C 16/045* (2013.01); *C23C 16/4408* (2013.01); *C23C 16/45527* (2013.01); *H01L 21/54* (2013.01); *H01L 21/67017* (2013.01); *H01L 21/6719* (2013.01); *H01L 21/67739* (2013.01); *H01L 21/67769* (2013.01)

(58) Field of Classification Search
CPC ................ C23C 16/448; C23C 16/455; C23C 16/45502; C23C 16/45523
See application file for complete search history.

(56) References Cited

U.S. PATENT DOCUMENTS

| | | |
|---|---|---|
| 7,128,787 B2 | 10/2006 | Castovillo et al. |
| 7,169,713 B2 | 1/2007 | Wu et al. |
| 7,235,482 B2 | 6/2007 | Wu et al. |

(Continued)

FOREIGN PATENT DOCUMENTS

JP   2012-009744 A   1/2012

OTHER PUBLICATIONS

Kinsley, Jr., George R., "Properly Purge and Inert Storage Vessels". CEP, Safety, Feb. 2001, pp. 57-61.*

(Continued)

*Primary Examiner* — Bret P Chen
(74) *Attorney, Agent, or Firm* — Lee & Morse, P.C.

(57) ABSTRACT

A method of manufacturing a semiconductor device, the method including supplying a first reactant to inside a processing chamber into which a substrate has been introduced; controlling a flow of a first purge gas and storing the first purge gas, of which flow has been controlled, in a first storage for a given time period; supplying the first purge gas from the first storage to the inside of the processing chamber after supplying the first reactant; and supplying a second reactant to the inside of the processing chamber after supplying the first purge gas.

8 Claims, 10 Drawing Sheets

(51) Int. Cl.
  *C23C 16/04* (2006.01)
  *C23C 16/44* (2006.01)

(56) References Cited

U.S. PATENT DOCUMENTS

| | | | |
|---|---|---|---|
| 7,910,177 B2 | 3/2011 | Li | |
| 8,308,871 B2* | 11/2012 | Tadaki | C23C 16/4405 134/22.18 |
| 8,372,201 B2 | 2/2013 | Provencher et al. | |
| 2003/0180458 A1* | 9/2003 | Sneh | C23C 16/4412 427/248.1 |
| 2003/0180462 A1* | 9/2003 | Chang | C23C 14/30 427/255.28 |
| 2006/0141152 A1* | 6/2006 | Oh | C23C 16/4401 427/248.1 |
| 2006/0210712 A1 | 9/2006 | Park et al. | |
| 2006/0280868 A1* | 12/2006 | Kato | C23C 16/4404 427/248.1 |
| 2007/0215036 A1 | 9/2007 | Park et al. | |
| 2007/0269982 A1* | 11/2007 | Rocklein | C23C 16/405 438/680 |
| 2010/0059797 A1* | 3/2010 | Ngai | H01L 21/6835 257/255 |
| 2011/0143035 A1* | 6/2011 | Cho | C23C 16/4481 427/255.28 |
| 2011/0311726 A1* | 12/2011 | Liu | C23C 16/4481 427/255.26 |
| 2012/0015106 A1* | 1/2012 | Maula | B01J 2/006 427/248.1 |
| 2012/0088373 A1* | 4/2012 | Ahn | C23C 16/401 438/763 |
| 2013/0192648 A1* | 8/2013 | Cho | B08B 9/093 134/22.1 |
| 2014/0147589 A1 | 5/2014 | Khandelwal et al. | |
| 2014/0225232 A1* | 8/2014 | Lin | H01L 21/3205 257/632 |
| 2015/0184295 A1 | 7/2015 | Jeong | |
| 2015/0211116 A1* | 7/2015 | Yang | C23C 16/481 118/715 |
| 2015/0259790 A1* | 9/2015 | Newman | C23C 16/27 423/446 |
| 2016/0035566 A1 | 2/2016 | Lavoie et al. | |
| 2016/0060754 A1 | 3/2016 | Noh et al. | |

OTHER PUBLICATIONS

University of California, Berkeley, Office of Environment, Health & Safety Brochure, "Compressed Gas Cylinders: Proper Management and Use". Jan. 2012, pp. 1-16.*

* cited by examiner

METHOD OF MANUFACTURING SEMICONDUCTOR DEVICE

CROSS-REFERENCE TO RELATED APPLICATION

Korean Patent Application No. 10-2016-0090778, filed on Jul. 18, 2016, in the Korean Intellectual Property Office, and entitled: "Method of Manufacturing Semiconductor Device," is incorporated by reference herein in its entirety.

BACKGROUND

1. Field

Embodiments relate to a method of manufacturing a semiconductor device.

2. Description of the Related Art

As semiconductor devices have been highly integrated and fine-sized in the manufacture thereof, aspect ratios of patterns constituting the semiconductor devices have gradually increased.

SUMMARY

The embodiments may be realized by providing a method of manufacturing a semiconductor device, the method including supplying a first reactant to inside a processing chamber into which a substrate has been introduced; controlling a flow of a first purge gas and storing the first purge gas, of which flow has been controlled, in a first storage for a given time period; supplying the first purge gas from the first storage to the inside of the processing chamber after supplying the first reactant; and supplying a second reactant to the inside of the processing chamber after supplying the first purge gas.

The embodiments may be realized by providing a method of manufacturing a semiconductor device, the method including providing a substrate inside a processing chamber; supplying a precursor gas to the inside of the processing chamber to form a precursor layer on the substrate controlling a flow of a purge gas via a mass flow controller (MFC) and an auxiliary MFC that have different opening/closing times of respective fluid openers/closers; supplying the purge gas, of which flow has been controlled, to the inside of processing chamber; and supplying a reaction gas to the inside of the processing chamber to form a thin film on the substrate by reacting the precursor layer and the reaction gas.

The embodiments may be realized by providing a method of manufacturing a semiconductor device, the method including providing a substrate inside a processing chamber such that the substrate includes a via hole or trench structure therein; and controlling a supply of a first reactant gas, a purge gas, and a second reactant gas to the processing chamber wherein the controlling the supply of the purge gas comprises controlling a flow of the purge gas via a mass flow controller (MFC) and an auxiliary MFC that have different opening/closing times of respective fluid openers/closers.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
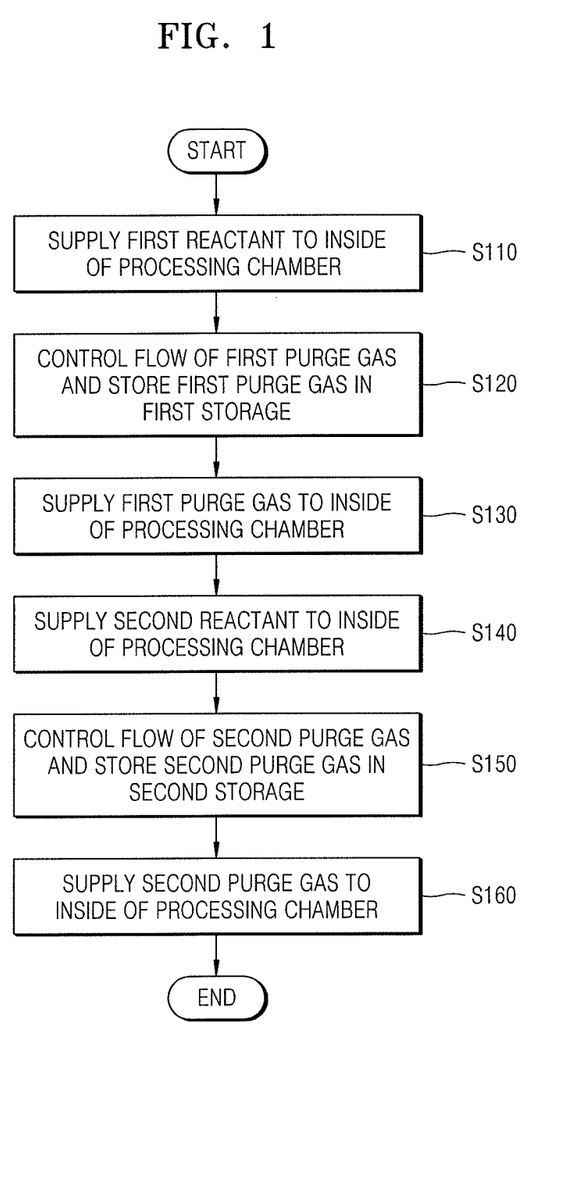
FIG. 1 illustrates a flowchart of a method of manufacturing a semiconductor device, according to an embodiment.

FIG. 1 illustrates a flowchart of a method of manufacturing a semiconductor device, according to an embodiment.

Referring to FIG. 1, in the method of manufacturing the semiconductor device according to an embodiment, a first reactant may be supplied inside a processing chamber into which a substrate is introduced (operation S110) and a part of the first reactant may be attached onto the substrate. For example, the first reactant may react with and/or be chemically adsorbed into or onto a surface of the substrate until a reaction of the first reactant and the surface of the substrate becomes saturated. When the reaction of the first reactant and the surface of the substrate becomes saturated by the first reactant, an excess of the first reactant may no longer react with the surface of the substrate.

After part of the first reactant is attached onto the substrate to a predetermined thickness of the first reactant, a first purge gas may be supplied to the inside of the processing chamber (operation S130). The first purge gas may discharge or purge the first reactant that is not attached onto the substrate (or otherwise remains in the processing chamber) to outside of the processing chamber.

In an implementation, before the first purge gas is supplied to the inside of the processing chamber, a flow of the first purge gas may be controlled by a first mass flow controller (MFC). The first purge gas (having the flow controlled by the first MFC) may be stored in a first storage (e.g., first gas storage or first storage vessel or tank) for a given or predetermined time period (operation S120). The first purge gas stored in the first storage may be supplied to the inside of the processing chamber when a first fluid opener/closer between the first storage and the processing chamber is opened.

After the first reactant remaining in the inside of the processing chamber is removed by the first purge gas, a second reactant may be supplied to the inside of the processing chamber (operation S140). The second reactant may react with and/or be chemically adsorbed into or onto the surface of the substrate (of which the first reactant is already attached onto). In this regard, the first reactant and the second reactant that are adsorbed in or on the substrate may chemically combine with each other. Thus, a thin film may be formed on the substrate.

When a reaction of the first reactant and the second reactant becomes saturated by the second reactant, an excess of the second reactant may no longer react with the surface of the substrate, and a second purge gas may be supplied to the inside of the processing chamber (operation S160). In this regard, before the second purge gas is supplied to the inside of the processing chamber, a flow of the second purge gas may be controlled by a second MFC. The second purge gas (having the flow controlled by the second MFC) may be stored in a second storage for a given or predetermined time period (operation S150). The second purge gas stored in the second storage may be supplied to the inside of the processing chamber when a second fluid opener/closer disposed between the second storage and the processing chamber is opened. The supplied second purge gas may discharge or purge the second reactant that has not reacted (or otherwise remains in the processing chamber) to the outside of the processing chamber to remove the second reactant In an implementation, argon (Ar) or nitrogen ($N_2$), which are inert or relatively stable gases, may be used as the first purge gas and the second purge gas. In an implementation, the first purge gas and the second purge gas may be stable gases that do not chemically react with the first reactant or the second reactant. In an implementation, the first reactant or the second reactant may include the same material.

Operations S110, S120, S130, S140, S150, and S160 may form a cycle. A thin film of a desired thickness may be formed on the substrate by repeating the cycle, e.g., a desired number of times.

The first reactant may be a precursor gas and may form a precursor layer on the substrate. The second reactant may be a reaction gas and may form a thin film by reacting with the precursor layer on the substrate. In an implementation, a third reactant may be additionally supplied to the inside of the processing chamber and may form the thin film through a chemical reaction with the surface of the substrate onto which the first reactant and the second reactant are or have been attached.

Figure 2A:
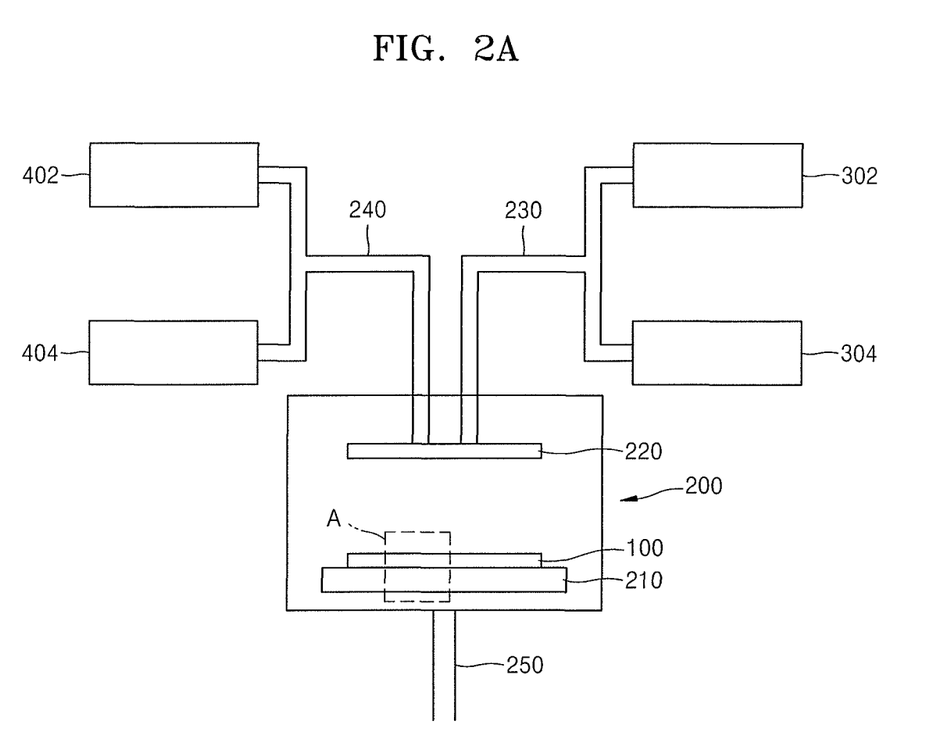
FIG. 2A illustrates a schematic cross-sectional view of a processing chamber used in a method of manufacturing a semiconductor device and a method of forming a thin film, according to an embodiment.
Figure 2B:
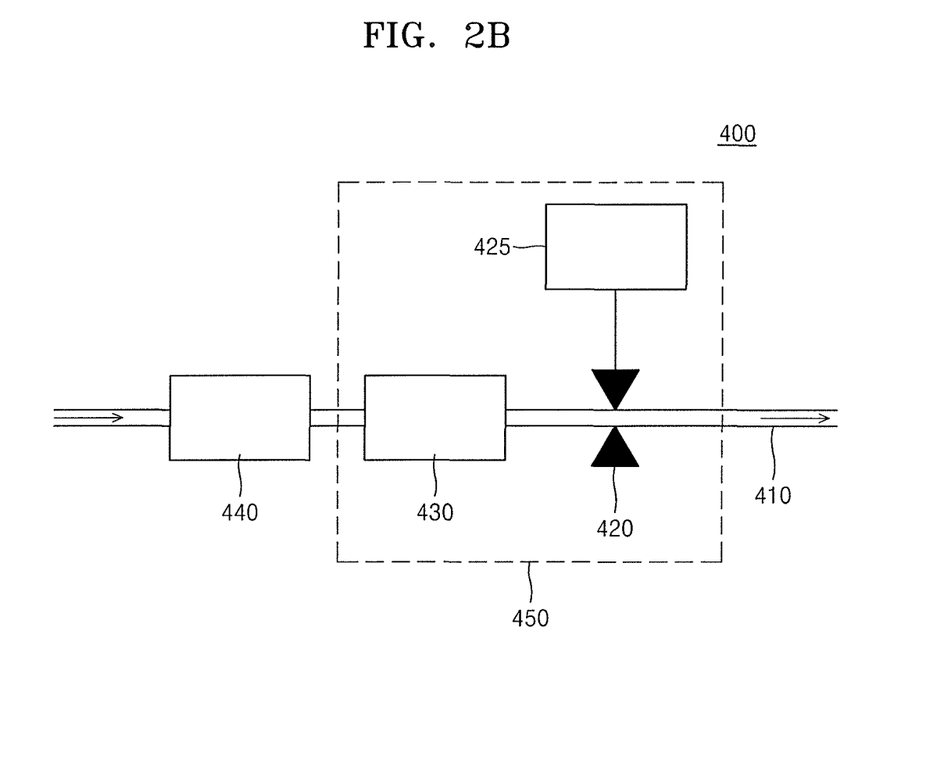
FIG. 2B illustrates a schematic view of a purge gas supplier used in a method of manufacturing a semiconductor device and a method of forming a thin film, according to an embodiment.

FIG. 2A illustrates a schematic cross-sectional view of a processing chamber 200 used in a method of manufacturing a semiconductor device and a method of forming a thin film, according to an embodiment. FIG. 2B illustrates a schematic view of a purge gas supplier 400 used in the method of manufacturing the semiconductor device and the method of forming the thin film, according to an embodiment.

Referring to FIGS. 1 and 2A, the processing chamber 200 used in the method of manufacturing the semiconductor device and the method of forming the thin film, according to an embodiment, may be an independent space sealed from the outside. The processing chamber 200 may include a source supply inlet 230 through which a reactant flows to inside of the processing chamber 200, a purge gas supply inlet 240 through which a purge gas flows, a distribution plate 220 that uniformly distributes supplied gases in the inside of the processing chamber 200, and an exhaust port 250 that discharges gas from inside the processing chamber 200 (e.g., a gas generated due to a reaction) to outside of the processing chamber 200.

A susceptor 210 may be arranged in the processing chamber 200. A substrate 100 introduced into the processing chamber 200 may be seated on the susceptor 210. The susceptor 210 may support the substrate 100 and may be implemented to rotate the substrate 100. The susceptor 210 may be implemented to rotate so that a thin film of a uniform thickness may be formed on the substrate 100.

A first reactant supplier 302 and a second reactant supplier 304 may be connected to the source supply inlet 230 through which the reactant flows. A first reactant generated or stored in the first reactant supplier 302 and a second reactant generated or stored in the second reactant supplier 304 may be supplied to the inside of the processing chamber 200 through the source supply inlet 230. The first reactant and the second reactant may be uniformly sprayed or distributed inside the processing chamber 200 by the distribution plate 220.

A first purge gas supplier 402 and a second purge gas supplier 404 may be connected to the purge gas supply inlet 240 through which the purge gas flows. A first purge gas generated or stored in the first purge gas supplier 402 and a second purge gas generated or stored in the second purge gas supplier 404 may be supplied to the inside of the processing chamber 200 through the purge gas supply inlet 240 and may be uniformly sprayed or distributed inside the processing chamber 200 by the distribution plate 220. In an implementation, methods of supplying the first reactant, the second reactant, the first purge gas, or the second purge gas to the inside of the processing chamber 200 may be different according to circumstances.

The exhaust port 250 may be formed in the processing chamber 200. In an implementation, a vacuum pump may be connected to the exhaust port 250. Air or gaseous contents of the processing chamber 200 may be pumped out by an operation of the vacuum pump, and the inside of the processing chamber 200 may be maintained at a low or high vacuum. An excess of the first reactant or an excess of the second reactant (e.g., that does not react with a surface of the substrate 100) may be discharged to the outside of the processing chamber 200 through the exhaust port 250, along with the first purge gas and/or the second purge gas, respectively. In an implementation, the exhaust port 250 may be arranged at a lower end of the processing chamber 200, e.g., as illustrated in FIG. 2A.

Referring to FIGS. 1, 2A, and 2B, in an implementation, each of the first purge gas supplier 402 and the second purge gas supplier 404 may have the same configuration as the purge gas supplier 400. The purge gas supplier 400 connected to the processing chamber 200 may include a gas supply line 410 (that supplies the first purge gas or the second purge gas to the processing chamber 200), an MFC 440, and an auxiliary MFC 450. A purge gas mentioned below may refer to the first purge gas or the second purge gas.

The MFC 440 may sense and control a flow of a supplied purge gas. In an implementation, it may take about 2 seconds for the MFC 440 to control the flow of the purge gas. The MFC 440 may include a pipe having a relatively smaller cross-section than that of the gas supply line 410. The purge gas supplied through the pipe may be supplied to the auxiliary MFC 450.

The MFC 440 may not include a separate gas storage. If the purge gas were to be supplied to the inside of the processing chamber 200 through only the MFC 440, the purge gas could be directly supplied through a narrow pipe formed in the MFC 440 without an operation of storing the purge gas. Thus, only a limited amount of a gas could be injected into the processing chamber 200 at one time.

The MFC 440 may include a fluid opener/closer. In this regard, a time taken by the MFC 440 to control the flow of the purge gas may include a time taken to close and open the fluid opener/closer of the MFC 440 or a time taken to open and close the fluid opener/closer of the MFC 440, i.e., an opening/closing time. Thus, the MFC 440 may have a limitation in controlling the flow of the purge gas within a time shorter than the opening/closing time.

The auxiliary MFC 450 may include a storage 430 (e.g., a gas storage tank), a fluid opener/closer 420, and an opener/closer controller 425. The auxiliary MFC 450 may be between the MFC 440 and the processing chamber 200.

The storage 430 may be connected to the MFC 440, may receive the purge gas (of which flow is primarily controlled from the MFC 440), and may store the purge gas for a given time period. The fluid opener/closer 420 may be connected to the storage 430 and may open/close the gas supply line 410. When the fluid opener/closer 420 is opened, the purge gas stored in the storage 430 may be supplied to the inside of the processing chamber 200 through the gas supply line 410. Thus, the flow of the purge gas may be secondarily controlled by the auxiliary MFC 450.

The fluid opener/closer 420 may perform an opening/closing operation by or in response to direction from the opener/closer controller 425. A time taken by the opener/closer controller 425 to open the fluid opener/closer 420 and supply the purge gas to the inside of the processing chamber 200 may be shorter than the time taken by the MFC 440 to control the flow of the purge gas. For example, the opening/closing time of the fluid opener/closer 420 (that is a time taken to close and open the fluid opener/closer 420 or a time taken to open and close the fluid opener/closer 420) may be shorter than the time taken by the MFC 440 to control the flow of the purge gas. In an implementation, the opening/closing time of the fluid opener/closer 420 of the auxiliary MFC 450 may be shorter than the opening/closing time of the fluid opener/closer of the MFC 440.

For example, the fluid opener/closer 420 may be a high speed valve. Opening/closing of the high speed valve may be controlled by using a method of changing a shape of a metal plate. The opening/closing of the high speed valve may be controlled to be below 0.05 seconds, and the time taken to control the flow of the purge gas may be reduced when the storage 430 and the fluid opener/closer 420 are used, compared to the case when only the MFC 440 is used. For example, the purge gas may be stored in the storage 430 for a given time and then a great amount of the purge gas may be instantly or rapidly injected into the processing chamber 200 by instantly or rapidly opening the closed high speed valve.

The closed fluid opener/closer 420 may be opened after the first reactant or second reactant has reacted with or at a surface of the substrate 100, and may quickly supply the purge gas into the inside of the processing chamber 200. Thus, a partial pressure of the purge gas may be reduced in an operation of making the reactant react with or at the surface of the substrate 100 in the processing chamber 200. A partial pressure of the first reactant or the second reactant may relatively increase An excess of the reactant (included or remaining in the processing chamber 200) may be efficiently discharged by instantly or rapidly increasing the partial pressure of the purge gas in an operation of discharging or purging an excess of the first reactant or the second reactant in the processing chamber 200. For example, a time taken to purge the excess of the first reactant or the second reactant may be reduced, thereby reducing a time taken to form the thin film of the semiconductor device and manufacture the semiconductor device. Accordingly, productivity of the semiconductor device may be improved.

Figure 3:
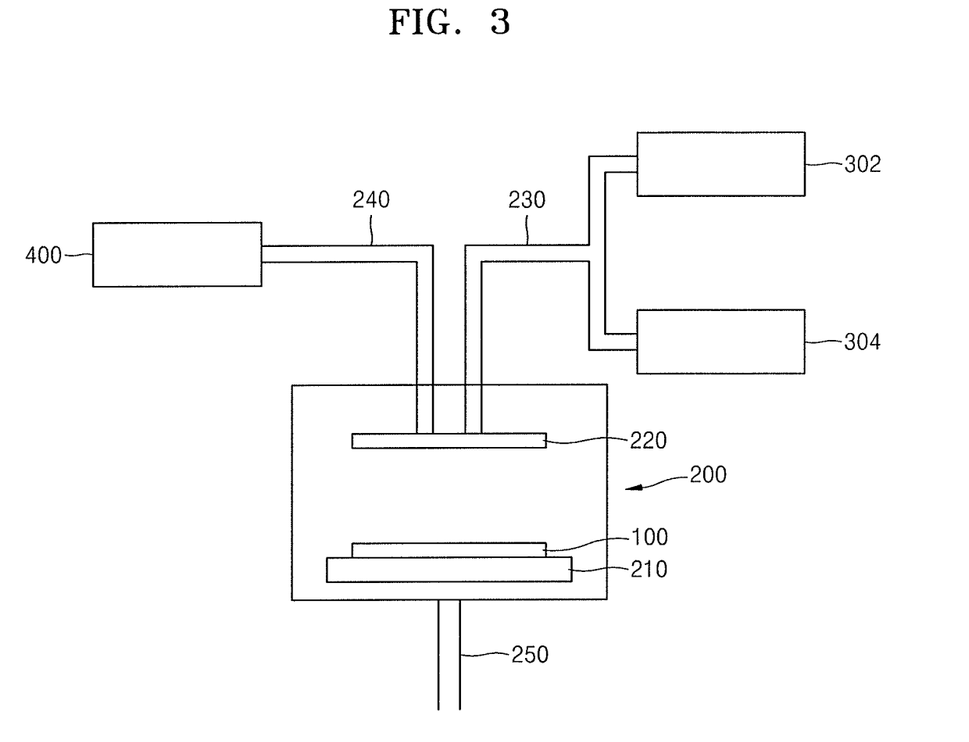
FIG. 3 illustrates a schematic cross-sectional view of a processing chamber used in a method of manufacturing a semiconductor device and a method of forming a thin film, according to an embodiment.

FIG. 3 illustrates a schematic cross-sectional view of the processing chamber 200 used in a method of manufacturing a semiconductor device and a method of forming a thin film, according to an embodiment. Redundant descriptions between FIG. 3 and FIG. 2A may be omitted.

Referring to FIGS. 1 and 3, the processing chamber 200 used in the method of manufacturing the semiconductor device and the method of forming the thin film according to an embodiment may include the source supply inlet 230, the purge gas supply inlet 240, the distribution plate 220, and the exhaust port 250

The first reactant supplier 302 and the second reactant supplier 304 may be connected to the source supply inlet 230 through which the reactant flows. The purge gas supplier 400 may be connected to the purge gas supply inlet 240 through which the purge gas flows. A first purge gas and a second purge gas may include the same material. In this case, the purge gas supplier 400 may supply the first purge gas and the second purge gas to inside of the processing chamber 200 through the purge gas supply inlet 240.

The purge gas supplier 400 may include a gas supply line, an MFC, a storage, and an fluid opener/closer that supply the first purge gas and/or the second purge gas to the processing chamber 200. The purge gas supplier 400 may be the same as the purge gas supplier 400 of FIG. 2B. The first purge gas and the second purge gas may be stored in the same storage and supplied to the inside of the processing chamber 200 when the opener/closer is opened. For example, the first purge gas and the second purge gas may be the same, and the gases may be supplied to the chamber by a single, simplified mechanism.

Figure 4A:
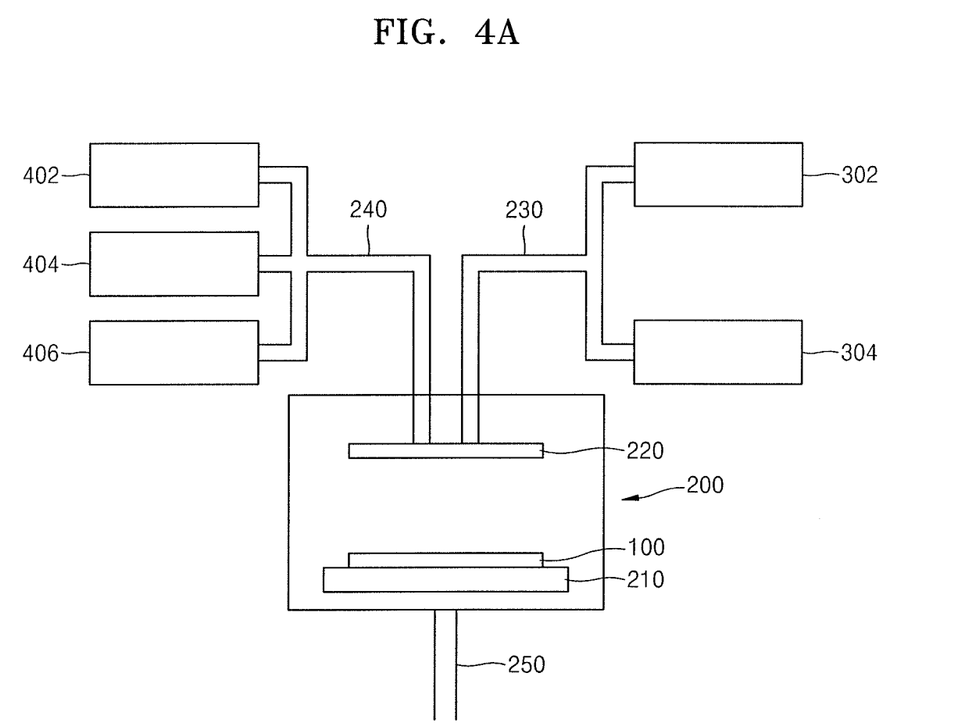
FIG. 4A illustrates a schematic cross-sectional view of a processing chamber used in a method of manufacturing a semiconductor device and a method of forming a thin film, according to an embodiment.
Figure 4B:
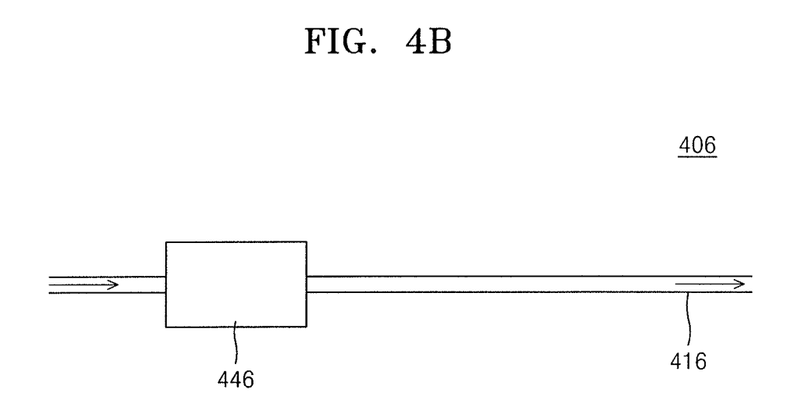
FIG. 4B illustrates a schematic view of a purge gas supplier used in a method of manufacturing a semiconductor device and a method of forming a thin film, according to an embodiment.

FIG. 4A illustrates a schematic cross-sectional view of the processing chamber 200 used in a method of manufacturing a semiconductor device and a method of forming a thin film, according to an embodiment. FIG. 4B illustrates a schematic view of the purge gas supplier 400 used in the method of manufacturing the semiconductor device and the method of forming the thin film, according to an embodiment. Redundant descriptions between FIGS. 4A and 4B and FIGS. 2A, 2B, and 3 may be omitted.

Referring to FIGS. 1 and 4A, the processing chamber 200 used in the method of manufacturing the semiconductor device and the method of forming the thin film according to an embodiment may include the source supply inlet 230, the purge gas supply inlet 240, the distribution plate 220, and the exhaust port 250.

The first reactant supplier 302 and the second reactant supplier 304 may be connected to the source supply inlet 230 through which the reactant flows. The first purge gas supplier 402, the second purge gas supplier 404, and a third purge gas supplier 406 may be connected to the purge gas supply inlet 240 through which the purge gas flows A first purge gas generated or stored in the first purge gas supplier 402, a second purge gas generated or stored in the second purge gas supplier 404, and a third purge gas generated or stored in the third purge gas supplier 406 may be supplied to inside of the processing chamber 200 through the purge gas supply inlet 240, and may be uniformly sprayed or distributed inside the processing chamber 200 by the distribution plate 220. In an implementation, methods of supplying the first reactant, the second reactant, the first purge gas, the second purge gas, or the third purge gas to the inside of the processing chamber 200 may be different according to circumstances.

Each of the first purge gas supplier 402 and the second purge gas supplier 404 may include the gas supply line 410 that supplies the first purge gas or the second purge gas to the processing chamber 200, the MFC 440, the storage 430, and the fluid opener/closer 420 of FIG. 2B. The first purge gas or the second purge gas (of which flow is primarily controlled by the MFC 440) may be stored in the storage 430 for a given time period. The first purge gas or the second purge gas stored in the storage 430 may be supplied to the inside of the processing chamber 200 if or when the first reactant or the second reactant ends or finishes reacting with or at a surface of the substrate 100 and the fluid opener/closer 420 is opened. For example, the flow of the first purge gas or the second purge gas may be controlled by the storage 430 and the fluid opener/closer 420.

Referring to FIGS. 1, 4A, and 4B, the third purge gas supplier 406 may include a gas supply line 416 (that supplies the third purge gas to the processing chamber 200) and an MFC 446.

During operation (S110) of supplying the first reactant to the inside of the processing chamber 200, operation (S130) of supplying the first purge gas to the inside of the processing chamber 200, and operation (S140) of supplying the second reactant to the inside of the processing chamber 200, an operation of supplying the third purge gas to the inside of the processing chamber 200 may be performed. In addition, during operation (S160) of supplying the second purge gas to the inside of the processing chamber 200, the third purge gas may be supplied to the inside of the processing chamber 200.

In this regard, a flow of the third purge gas that flows into the processing chamber 200 may be substantially maintained consistent or constant. The third purge gas may not need to instantly change the flow, and the third purge gas supplier 406 may include only the MFC 446 (without the storage 430 and the fluid opener/closer 420). In an implementation, the third purge gas and the first purge gas may include the same material.

Thus, the flow of the third purge gas supplied during operation (S110) of supplying the first reactant to the inside of the processing chamber 200 and operation (S140) of supplying the second reactant to the inside of the processing chamber 200 may be smaller than a total flow of the first purge gas and the third purge gas supplied in operation (S130) of supplying the first purge gas and a total flow of the second purge gas and the third purge gas supplied in operation (S160) of supplying the second purge gas.

In an implementation, argon or nitrogen, which are inert or relatively stable gases, may be used as the third purge gas.

In an implementation, the third purge gas may be a stable gas that does not chemically react with the first reactant or the second reactant.

Figure 5:
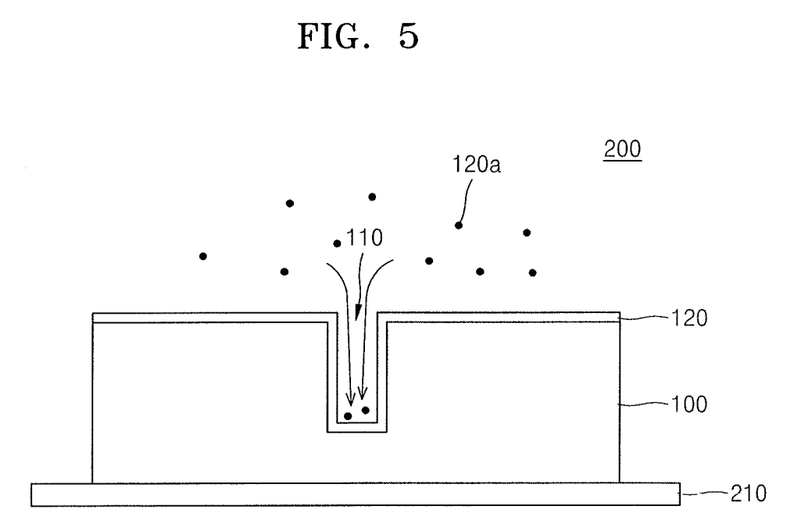
FIG. 5 illustrates a cross-sectional view of a substrate used in a method of manufacturing a semiconductor device and a method of forming a thin film, according to an embodiment and is an enlarged cross-sectional view of a portion A of FIG. 2A.

FIG. 5 illustrates a cross-sectional view of the substrate 100 used in a method of manufacturing a semiconductor device and a method of forming a thin film 120, according to an embodiment and is an enlarged cross-sectional view of a portion A of FIG. 2A.

Referring to FIGS. 1 and 5, the processing chamber 200 may form an independent space sealed from outside. In an implementation, the substrate 100 seated on the susceptor 210 included in the processing chamber 200 may include a semiconductor material, e.g., a group IV semiconductor, a group III-V compound semiconductor, or a group II-VI oxide semiconductor. For example, the group IV semiconductor may include silicon, germanium, or silicon-germanium. The substrate 100 may be provided as a bulk wafer or an epitaxial layer. In an implementation, the substrate 100 may be formed of a semiconductor substrate such as a silicon-on-insulator (SOI) substrate, a gallium-arsenic substrate, a silicon germanium substrate, or the like. For example, unit devices for forming a semiconductor device, such as various types of active devices or passive devices, may be formed on the substrate 100. In an implementation, the substrate 100 may be, e.g., an insulator substrate including silicon dioxide ($SiO_2$) or other inorganic oxides, a glass substrate, or the like.

A via hole or a trench structure 110 may be formed in the substrate 100. When the via hole or the trench structure 110 has a high aspect ratio, it may be difficult for a reactant 120a (for forming the thin film 120) to arrive at or in the via hole or a lower surface of the trench structure 110, and it may be difficult to uniformly form the thin film 120 on the substrate 100 (e.g., in the via hole). The reactant 120a may be the first reactant or second reactant.

In order for the reactant 120a to arrive at or be provided into the via hole or the lower surface of the trench structure 110, a partial pressure of the reactant 120a inside the processing chamber 200 for forming the thin film 120 may be increased. A method of increasing a flow for supplying the reactant 120a inside the processing chamber 200 may be limited.

Therefore, when the reactant 120a is supplied to the inside of the processing chamber 200, a flow of a material (other than the reactant) that is supplied along with the reactant 120a may be reduced, thereby increasing the partial pressure of the reactant 120a. For example, when the reactant 120a is supplied to the inside of the processing chamber 200, a flow of the third purge gas that is supplied along with the reactant 120a may be reduced. In this regard, an effect will be described in detail with reference to FIGS. 7A and 7B.

Figure 6A:
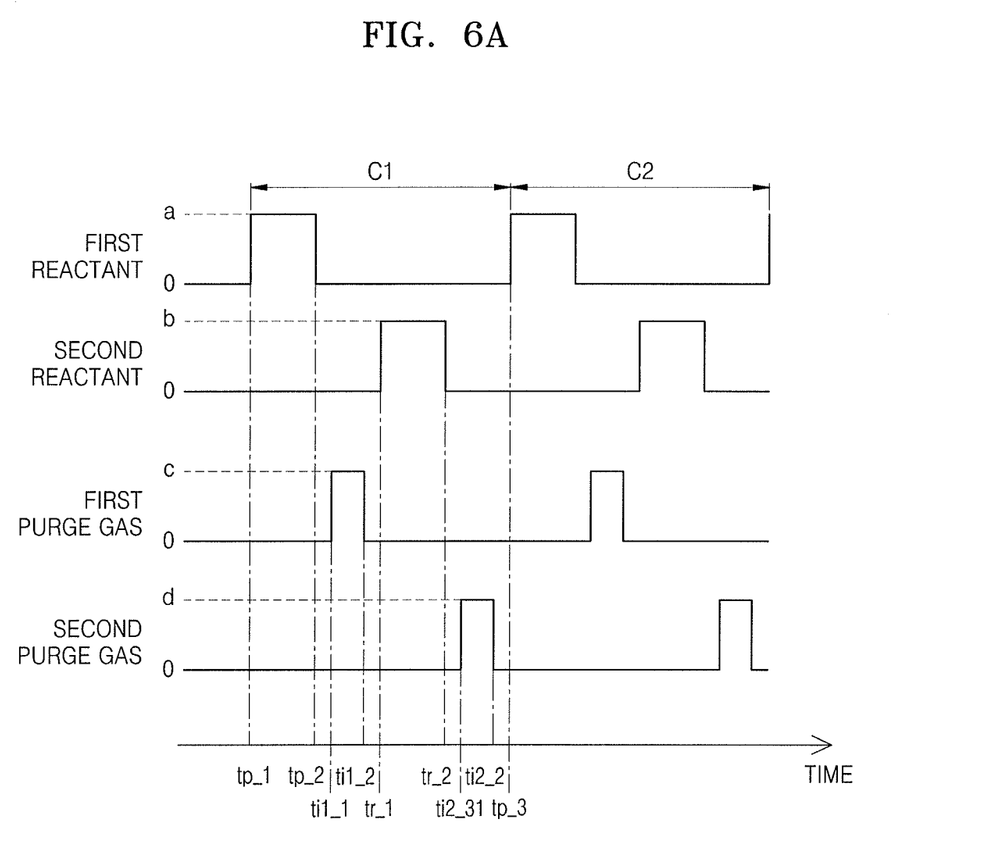
FIG. 6A illustrates a timing diagram of a supply of gas in a method of manufacturing a semiconductor device and a method of forming a thin film, according to an embodiment.

FIG. 6A illustrates a timing diagram of a supply of gas in a method of manufacturing a semiconductor device and a method of forming a thin film, according to an embodiment.

Referring to FIGS. 1 and 6A, the method of manufacturing the semiconductor device according to an embodiment may include operation (S110) of supplying a first reactant to inside of a processing chamber, operation (S130) of supplying a first purge gas to the inside of the processing chamber, operation (S140) of supplying a second reactant to the inside of the processing chamber, and operation (S160) of supplying a second purge gas to the inside of the processing chamber that are repeatedly performed at a certain cycle C1 to form the thin film on a substrate introduced on the processing chamber.

Accordingly, a section (e.g., time period) in which the first reactant and the second reactant are supplied to the inside of the processing chamber by certain flows a and b and a section in which the first reactant and the second reactant are not supplied to the inside of the processing chamber at certain flows a and b may be repeated on a certain period. A section in which the first purge gas and the second purge gas are supplied to the inside of the processing chamber by certain flows c and d and a section in which the first purge gas and the second purge gas are not supplied to the inside of the processing chamber at certain flows c and d may also be repeated on a certain period.

The first purge gas may not be supplied to the inside of the processing chamber while the first reactant is supplied to the inside of the processing chamber and while the second reactant is supplied to the inside of the processing chamber. Operation (S130) of supplying the first purge gas to the inside of the processing chamber may start after operation (S110) of supplying the first reactant to the processing chamber ends. For example, a time ti1_1 (at which operation (S130) of supplying the first purge gas to the inside of the processing chamber starts) may be later than or after a time tp_2 (at which operation (S110) of supplying the first reactant to the processing chamber ends). The time ti1_1 and the time tp_2 may have a time interval, e.g., may have a predetermined period of time elapse therebetween.

Operation (S140) of supplying the second reactant to the inside of the processing chamber may start after operation (S130) of supplying the first purge gas to the processing chamber ends. For example, a time ti1_2 (at which operation (S140) of supplying the second reactant to the inside of the processing chamber starts) may be later than or after a time tr_1 (at which operation (S130) of supplying the first purge gas to the processing chamber ends). A time interval may exist between the time ti1_2 and the time tr_1, e.g., supplying the second reactant to the inside of the processing chamber may not begin immediately after supplying the first purge gas to the processing chamber ends, and a predetermined amount of time may elapse therebetween.

The second purge gas may also not be supplied to the inside of the processing chamber while the first reactant is supplied to the inside of the processing chamber and while the second reactant is supplied to the inside of the processing chamber. Operation (S160) of supplying the second purge gas to the inside of the processing chamber may start after operation (S140) of supplying the second reactant to the processing chamber ends. For example, a time ti2_1 (at which operation (S160) of supplying the second purge gas to the inside of the processing chamber starts) may be later than or after a time tr_2 (at which operation (S140) of supplying the second reactant to the processing chamber ends). The time ti2_1 and the time tr_2 may have a time interval, e.g., may have a predetermined period of time elapse therebetween.

Operation (S110) of (again) supplying the first reactant to the processing chamber may also start after operation (S160) of supplying the second purge gas to the inside of the processing chamber ends. For example, a time tp_3 (at which operation (S110) of again supplying the first reactant to the processing chamber starts) may be later than or after a time ti2_2 (at which operation (S160) of supplying the second purge gas to the inside of the processing chamber ends). The time tp_3 and the time ti2_2 may have a time interval, e.g., may have a predetermined period of time elapse therebetween.

In an implementation, the second purge gas may include the same material as the first purge gas. In an implementation, a value d of flow of the second purge gas may be the same as a value c of flow of the first purge gas.

Figure 6B:
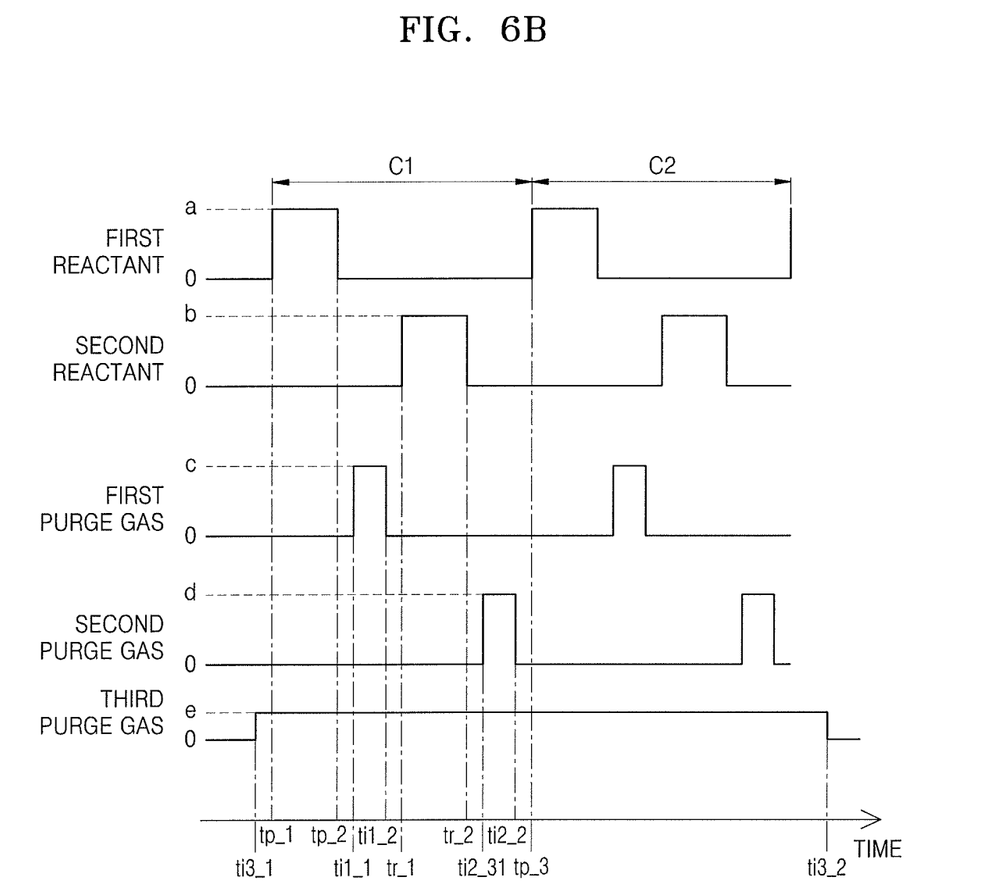
FIG. 6B illustrates a timing diagram of a supply of gas in a method of manufacturing a semiconductor device and a method of forming a thin film, according to an embodiment.

FIG. 6B illustrates a timing diagram of a supply of gas in a method of manufacturing a semiconductor device and a method of forming a thin film, according to another embodiment. Detailed descriptions between FIG. 6B and FIG. 6A may be omitted.

Referring to FIGS. 1 and 6B, the method of manufacturing the semiconductor device according to another embodiment may include operation (S110) of supplying a first reactant to inside of the processing chamber 200, operation (S130) of supplying a first purge gas to the inside of the processing chamber 200, operation (S140) of supplying a second reactant to the inside of the processing chamber 200, and operation (S160) of supplying a second purge gas to the inside of the processing chamber 200 that are repeatedly performed at a certain cycle C1 to form the thin film on a substrate in the processing chamber 200. In this regard, the third purge gas may be supplied to the inside of the processing chamber 200 in or throughout operation (S110) of supplying the first reactant to inside of the processing chamber 200, operation (S130) of supplying the first purge gas to the inside of the processing chamber 200, operation (S140) of supplying the second reactant to the inside of the processing chamber 200, and operation (S160) of supplying the second purge gas to the inside of the processing chamber 200.

The same flow e of the third purge gas may be continuously or constantly supplied to the inside of the processing chamber 200. The flow e of the third purge gas may have a smaller value than those of a flow c of the first purge gas and a flow d of the second purge gas. Thus, a total flow of the purge gas supplied in operation (S110) of supplying the first reactant to inside of the processing chamber 200 and the total flow of the purge gas supplied in operation (S140) of supplying the second reactant to the inside of the processing chamber 200 may have a smaller value than that of a total flow of the first purge gas and the third purge gas supplied in operation (S130) of supplying the first purge gas to the inside of the processing chamber 200. The total flow of the purge gas supplied in operation (S110) of supplying the first reactant to inside of the processing chamber 200 and the total flow of the purge gas supplied in operation (S140) of supplying the second reactant to the inside of the processing chamber 200 may have a smaller value than that of a total flow of the second purge gas and the third purge gas supplied in operation (S160) of supplying the second purge gas to the inside of the processing chamber 200.

Supplying third purge to the inside of the processing chamber 200 may begin prior to operation (S110) of supplying the first reactant to inside of the processing chamber 200. For example, a time ti3_1 (at which supply of the third purge gas starts) may be earlier than the time tp_1 (at which operation (S110) of supplying the first reactant to the processing chamber starts). The time ti3_1 and the time tp_1 may have a time interval, e.g., may have a predetermined period of time elapse therebetween. In an implementation, after the cycle C1 ends, at a next cycle C2, the third purge gas may be supplied to the inside of the processing chamber 200. In an implementation, when supply of the second purge gas ends, supply of the third purge gas may also end. In an implementation, when supply of the first reactant starts at a next cycle, supply of the third purge gas may also start.

In an implementation, the third purge gas may include the same material as the first purge gas or the second purge gas.

Figure 7A:
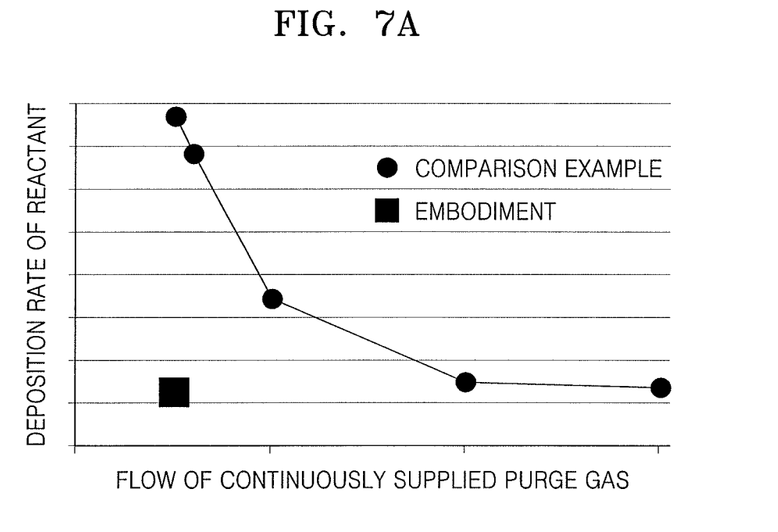
FIG. 7A illustrates a graph of a deposition rate with respect to a flow of a purge gas supplied in a method of manufacturing a semiconductor device and a method of forming a thin film, according to an embodiment.

FIG. 7A illustrates a graph of a deposition rate with respect to a flow of a purge gas supplied in a method of manufacturing a semiconductor device and a method of forming a thin film, according to an embodiment.

FIGS. 1 and 7A show the deposition rate of a thin film with respect to the flow of the purge gas. According to an embodiment, operation (S110) of supplying a first reactant to inside of a processing chamber, operation (S130) of supplying a first purge gas to the inside of the processing chamber, operation (S140) of supplying a second reactant to the inside of the processing chamber, and operation (S160) of supplying a second purge gas to the inside of the processing chamber may be performed in order to form the thin film on a substrate introduced on the processing chamber. In an implementation, a uniform flow of the third purge gas may be continuously supplied to the inside of the processing chamber in operations S110, S130, S140, and S160. In this regard, an experiment was conducted under the conditions that the first purge gas, the second purge gas, and the third purge gas include nitrogen, and a flow of the first purge gas and the second purge gas were respectively about 10 times a flow of the third purge gas.

In a comparison example, during supply of the first reactant to the inside of the processing chamber, and supply of the second reactant to the inside of the processing chamber, a uniform flow of a purge gas was continuously supplied in order to form the thin film on a substrate introduced on the processing chamber. A deposition rate of a reactant with respect to an increase in the flow of the purge gas was analyzed.

According to the experimental results, the deposition rate of the reactant was increased when the flow of the purge gas was insufficient. This means that excess reactants were adsorbed in or on the substrate when the thin film is formed on the substrate. Thus, the excess reactants were not sufficiently purged and discharged to the outside of the processing chamber.

According to an embodiment, even if a flow of the third purge gas (that is a continuously supplied purge gas) is small, if operation (S110) of supplying a first reactant to inside of a processing chamber or operation (S140) of supplying a second reactant to the inside of the processing chamber were not performed, the first purge gas and the second purge gas may be sufficiently supplied to the inside of the processing chamber, and an excess of the first reactant or the second reactant that fails to react may be sufficiently purged. Thus, a time taken to purge the excess of the first reactant or the second reactant may be reduced, thereby increasing productivity of the semiconductor device.

Figure 7B:
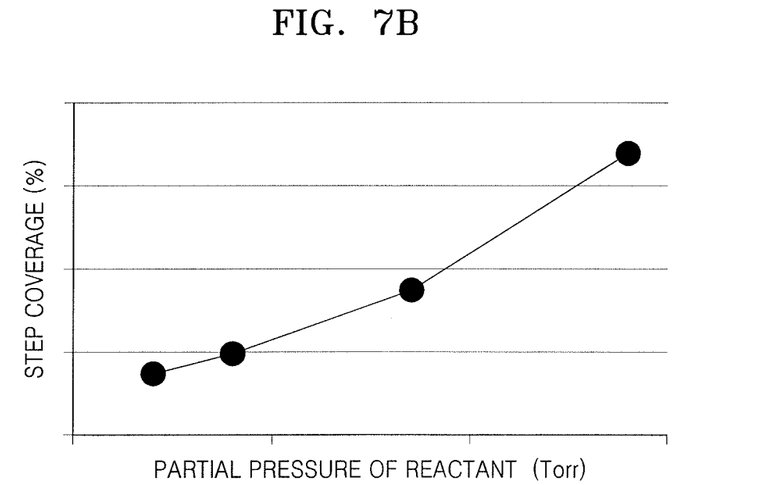
FIG. 7B illustrates a graph of a step coverage characteristic with respect to a partial pressure of a reactant in a method of manufacturing a semiconductor device and a method of forming a thin film, according to an embodiment.

FIG. 7B illustrates a graph of a step coverage characteristic with respect to a partial pressure of a reactant in a method of manufacturing a semiconductor device and a method of forming a thin film, according to an embodiment.

FIG. 7B shows that the step coverage characteristic of the thin film is improved as the partial pressure of the reactant increases. A vertical structure, e.g., a via hole or trench structure, may formed on a substrate. When the vertical structure has a high aspect ratio, it may be relatively difficult for the reactant to arrive at or be supplied to a lower, bottom, or inner surface of the vertical structure. Thus, if a pressure of the reactant increases when the reactant is supplied to inside of a processing chamber, the reactant may arrive at or be supplied to the lower surface of the vertical structure, and thus the step coverage characteristic may be improved.

However, there may be a limit to an increase in only the pressure of the reactant, and the partial pressure of the reactant may increase by reducing a pressure of a material supplied along with the reactant such as the purge gas.

Referring to FIGS. 1, 7A, and 7B, according to an embodiment, although a small amount of the third purge gas may be continuously supplied to the inside of the processing chamber during operation (S110) of supplying a first reactant to inside of a processing chamber, operation (S130) of supplying a first purge gas to the inside of the processing chamber, operation (S140) of supplying a second reactant to the inside of the processing chamber, and operation (S160) of supplying a second purge gas to the inside of the processing chamber, an excess of a reactant that fails to react may be sufficiently discharged to outside of the processing chamber by supplying the first purge gas and the second purge gas to the inside of the processing chamber. The small amount of the third purge gas may be supplied, and the partial pressure of the first reactant gas and the second reactant gas may be relatively increased and the step coverage characteristic of the thin film formed on the substrate may be improved in operation (S110) of supplying the first reactant to inside of the processing chamber and operation (S140) of supplying the second reactant to the inside of the processing chamber.

Figure 8:
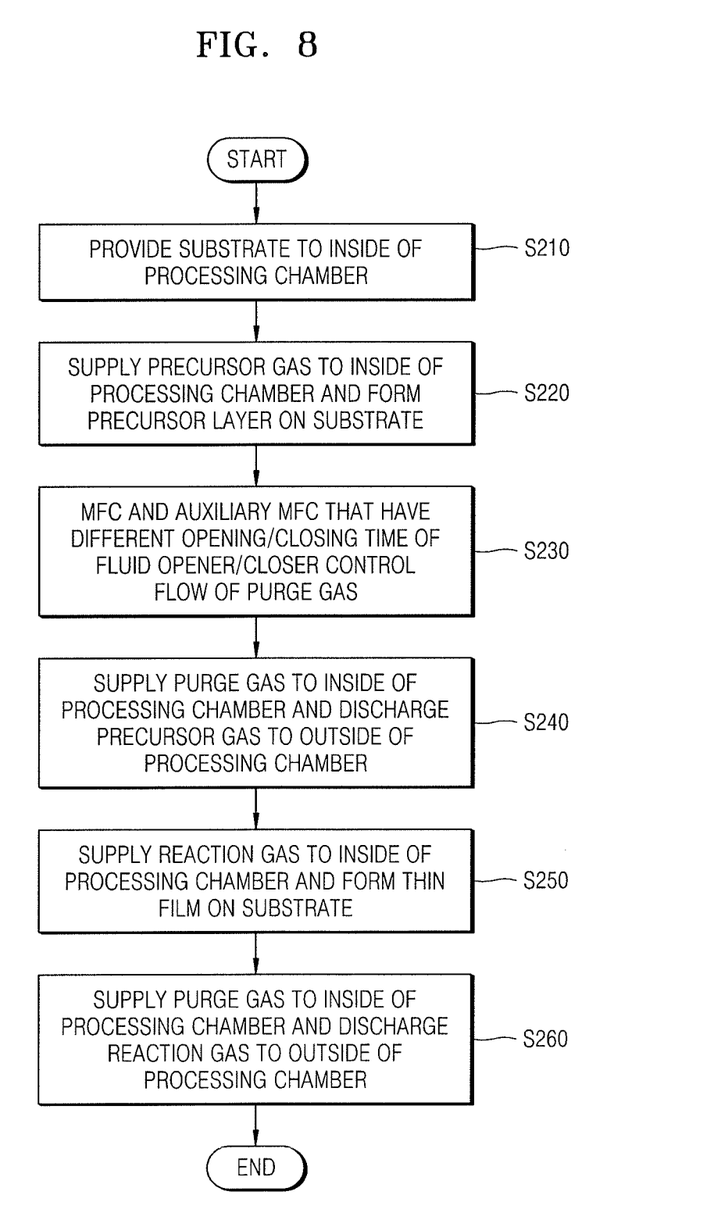
FIG. 8 illustrates a flowchart of a method of manufacturing a semiconductor device, according to an embodiment.

FIG. 8 illustrates a flowchart of a method of manufacturing a semiconductor device, according to an embodiment. Redundant descriptions between FIG. 8 and FIGS. 1 and 7B may be omitted.

Referring to FIG. 8, a method of manufacturing the semiconductor device according to an embodiment may including providing a substrate to inside of a processing chamber in which a purge gas supplier is formed (S210) and supplying a precursor gas to the inside of the processing chamber to form a precursor layer on the substrate (S220). The processing chamber may include the processing chamber 200 of FIGS. 2A, 3, and 4A.

The precursor gas may react with and/or be chemically adsorbed into or onto a surface of the substrate until a reaction of the precursor and the surface of the substrate becomes saturated. When the reaction of the precursor and the surface of the substrate becomes saturated, an excess of or remaining precursor gas may no longer react with the surface. Thus, after the precursor layer is attached onto or formed on the substrate to a certain thickness, a purge gas (of which flow is controlled) may be supplied to the inside of the processing chamber through the purge gas supplier. The purge gas supplier may include a purge gas supplier of FIG. 2B or a third purge gas supplier of FIG. 4B.

The flow of the purge gas that is supplied to the inside of the processing chamber may be controlled by an MFC and an auxiliary MFC that have different opening/closing time of a fluid opener/closer (S230). The auxiliary MFC may be disposed between the MFC and the processing chamber. The auxiliary MFC may include a storage that stores the purge gas and the fluid opener/closer disposed between the storage and the processing chamber.

The storage may receive the purge gas from the MFC and may temporarily store the purge gas. The fluid opener/closer of the auxiliary MFC may open/close the purge gas supplier or supply line. The flow of the purge gas may be controlled in a manner of supplying the purge gas stored in the storage to the processing chamber by opening/closing the fluid opener/closer of the auxiliary MFC.

A time taken to open the closed fluid opener/closer of the auxiliary MFC may be shorter than a time taken by the MFC to control the flow of the purge gas. For example, an opening/closing time of the fluid opener/closer of the auxiliary MFC may be shorter than an opening/closing time of the fluid opener/closer of the MFC. If the fluid opener/closer of the auxiliary MFC is opened, the purge gas (of which flow is controlled) may be supplied to the inside of the processing chamber, and an excess of the precursor gas that fails to form the precursor layer may be discharged (S240).

When the supply of the purge gas ends, a reaction gas may be supplied to the inside of the processing chamber, the precursor layer and the reaction gas react with each other, and the thin film may be formed on the substrate (S250). The reaction gas may react with and chemically adsorb onto the surface of the substrate (on which the precursor is attached). The precursor layer and the reaction gas that are adsorbed onto the substrate may chemically combine with each other, and thus the thin film may be formed on the substrate.

After operation (S250) of forming the thin film, the purge gas may be supplied to the inside of the processing chamber again, and an excess of the reaction gas that fails to form the thin film may be discharged (S260). In an implementation, argon or nitrogen, which are inert or relatively stable gases, may be used as the purge gas. The purge gas may be a stable gas that does not chemically react with the precursor gas or the reaction gas.

In operation (S220) of forming the precursor layer and operation (S250) of forming the thin film, supply of the purge gas to the inside of the processing chamber may be blocked by closing the fluid opener/closer of the auxiliary MFC connected to the purge gas supplier. When operation (S220) of forming the precursor layer or operation (S250) of forming the thin film ends, a opener/closer controller (that controls the fluid opener/closer of the auxiliary MFC) may open the fluid opener/closer of the auxiliary MFC so that the purge gas stored in the storage is supplied to the inside of the processing chamber.

A via hole or trench structure may be formed on the substrate. Operation (S250) of forming the thin film may include forming the thin film on inner walls of the via hole or trench structure. In operation (S220) of forming the precursor layer and operation (S250) of forming the thin film, supply of the purge gas to the inside of the processing chamber may be blocked, a partial pressure of the precursor gas or the reactant gas may increase, and the thin film may be effectively formed on inner walls of a vertical structure formed on the substrate.

Operation (S220) of forming the precursor layer, operation (S240) of discharging the precursor gas, operation (S250) of forming the thin film, and operation (S260) of discharging the reaction gas may be repeatedly performed a plurality of times at a given period cycle. For example, operations S220, S240, S250, and S260 may be repeatedly performed until the thin film is formed on the substrate to a certain thickness.

By way of summation and review, a structure having a high aspect ratio may utilize a deposition technology able of providing an excellent step coverage characteristic. A method according to an embodiment may efficiently discharge materials used to form thin films to the outside of a processing chamber in a short time period.

The embodiments may provide a method of manufacturing a semiconductor device with an improved step coverage characteristic.

The embodiments may provide a method of manufacturing a semiconductor device with increased productivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   supplying a first reactant to inside a processing chamber into which a substrate has been introduced;
   controlling, with a first valve, a flow of a first purge gas into a first storage and storing the first purge gas, of which flow has been controlled with the first valve, in the first storage for a given time period;
   supplying the first purge gas from the first storage to the inside of the processing chamber by opening a second valve between the first storage and the processing chamber after supplying the first reactant;
   supplying a second reactant to the inside of the processing chamber after supplying the first purge gas; and
   supplying an auxiliary purge gas to the inside of the processing chamber,
   wherein supplying the auxiliary purge gas is performed simultaneously with the supplying of the first reactant, the supplying of the first purge gas, and the supplying of the second reactant.

2. The method as claimed in claim 1, further comprising:
   controlling a flow of a second purge gas and storing the second purge gas, of which flow has been controlled, in a second storage for a given time period; and
   supplying the second purge gas from the second storage to the inside of the processing chamber after supplying the second reactant.

3. The method as claimed in claim 2, further comprising supplying the second purge gas from the second storage prior to supplying the first reactant.

4. The method as claimed in claim 2, wherein the first purge gas and the second purge gas include a same material and are supplied to the inside of the processing chamber after being stored in a same storage.

5. The method as claimed in claim 1, wherein the first purge gas is supplied for a shorter time period than each of the supplying of the first reactant and the supplying of the second reactant.

6. The method as claimed in claim 1, wherein an amount of the auxiliary purge gas supplied to the inside the processing chamber substantially remains constant over time.

7. The method as claimed in claim 1, wherein the first purge gas and the auxiliary purge gas include a same material.

8. The method as claimed in claim 1, wherein a flow of the auxiliary purge gas supplied during the supplying of the first reactant and the supplying of the second reactant has a smaller value than a total flow of the first purge gas and the auxiliary gas supplied during the supplying of the first purge gas.

* * * * *